(12) United States Patent
Koike et al.

(10) Patent No.: US 8,461,051 B2
(45) Date of Patent: Jun. 11, 2013

(54) CLUSTER JET PROCESSING METHOD, SEMICONDUCTOR ELEMENT, MICROELECTROMECHANICAL ELEMENT, AND OPTICAL COMPONENT

(75) Inventors: Kunihiko Koike, Moriyama (JP); Takehiko Senoo, Osaka (JP); Yu Yoshino, Moriyama (JP); Shuhei Azuma, Tokyo (JP); Jiro Matsuo, Uji (JP); Toshio Seki, Uji (JP); Satoshi Ninomiya, Uji (JP)

(73) Assignees: Iwatani Corporation, Osaka-Shi, Osaka (JP); Kyoto University, Kyoto-Shi, Kyoto (JP)

( * ) Notice: Subject to any disclaimer, the term of this patent is extended or adjusted under 35 U.S.C. 154(b) by 282 days.

(21) Appl. No.: 13/059,340

(22) PCT Filed: Aug. 10, 2009

(86) PCT No.: PCT/JP2009/064131
§ 371 (c)(1),
(2), (4) Date: Feb. 16, 2011

(87) PCT Pub. No.: WO2010/021265
PCT Pub. Date: Feb. 25, 2010

(65) Prior Publication Data
US 2011/0147896 A1    Jun. 23, 2011

(30) Foreign Application Priority Data
Aug. 18, 2008 (JP) ................................ 2008-210140

(51) Int. Cl.
*H01L 21/302* (2006.01)
*H01L 23/20* (2006.01)
*G21G 5/00* (2006.01)
*C23C 14/32* (2006.01)

(52) U.S. Cl.
USPC .... 438/706; 257/682; 250/492.3; 204/192.34

(58) Field of Classification Search
None
See application file for complete search history.

(56) References Cited

U.S. PATENT DOCUMENTS 4,909,914 A    3/1990    Chiba et al.
5,814,194 A *  9/1998    Deguchi et al. ............ 204/192.1
(Continued)

FOREIGN PATENT DOCUMENTS

CN    1359531 A    7/2002
CN    2659541 Y    12/2004
(Continued)

OTHER PUBLICATIONS

Office Action dated Sep. 24, 2012, issued by the Chinese Patent Office in the corresponding Chinese Patent Application No. 200980132360.4. (10 pages).
(Continued)

*Primary Examiner* — Alonzo Chambliss
(74) *Attorney, Agent, or Firm* — Buchanan Ingersoll & Rooney PC

(57) ABSTRACT

A method for processing a sample using an electrically neutral reactive cluster is provided. The surface of a sample is processed by jetting out a mixed gas that is composed of a reactive gas and a gas with a boiling point lower than that of the reactive gas from a gas jetting part of a vacuum process room in which the sample is placed by a pressure in a range in which the mixed gas is not liquefied, in a predetermined direction, while adiabatically-expanding the mixed gas, thereby generating a reactive cluster and jetting the reactive cluster against the sample in the vacuum process room.

15 Claims, 13 Drawing Sheets

U.S. PATENT DOCUMENTS

| | | | |
|---|---|---|---|
| 6,013,332 A * | 1/2000 | Goto et al. | 427/530 |
| 6,245,192 B1 | 6/2001 | Dhindsa et al. | |
| 6,251,835 B1 * | 6/2001 | Chu et al. | 505/411 |
| 6,368,518 B1 * | 4/2002 | Vaartstra | 216/67 |
| 6,432,831 B2 | 8/2002 | Dhindsa et al. | |
| 6,449,873 B1 | 9/2002 | Yoon et al. | |
| 7,410,890 B2 * | 8/2008 | Kirkpatrick et al. | 438/510 |
| 2001/0027026 A1 | 10/2001 | Dhindsa et al. | |
| 2003/0021908 A1 * | 1/2003 | Nickel et al. | 427/551 |
| 2003/0070620 A1 | 4/2003 | Cooperberg et al. | |
| 2003/0073314 A1 | 4/2003 | Skinner et al. | |
| 2004/0129210 A1 | 7/2004 | Murugesh | |
| 2005/0205802 A1 | 9/2005 | Swenson et al. | |
| 2006/0278611 A1 | 12/2006 | Sato et al. | |
| 2010/0041238 A1 | 2/2010 | Cooperberg et al. | |

FOREIGN PATENT DOCUMENTS

| | | |
|---|---|---|
| CN | 1639831 A | 7/2005 |
| CN | 1860593 A | 11/2006 |
| JP | 62-7442 A | 1/1987 |
| JP | 62-44960 A | 2/1987 |
| JP | 2-102533 A | 4/1990 |
| JP | 8-120470 A | 5/1996 |
| JP | 8-319105 A | 12/1996 |
| JP | 2005-512312 A | 4/2005 |
| JP | 2005-310977 A | 11/2005 |
| JP | 2007-529876 A | 10/2007 |
| JP | 2007-321185 A | 12/2007 |
| KR | 2001-0047111 A | 6/2001 |
| WO | WO 2005/031838 A1 | 4/2005 |

OTHER PUBLICATIONS

International Search Report (PCT/ISA/210) issued on Sep. 8, 2009, by Japanese Patent Office as the International Searching Authority for International Application No. PCT/JP2009/064131.

Korean Office Action dated Jul. 18, 2012, issued by the Korean Patent Office in corresponding Korean Patent Application No. 10-2011-7003038. (4 pages).

Taiwanese Office Action issued Feb. 19, 2013 by the Taiwanese Patent Office in Taiwanese Application No. 098127527.

* cited by examiner

CLUSTER JET PROCESSING METHOD, SEMICONDUCTOR ELEMENT, MICROELECTROMECHANICAL ELEMENT, AND OPTICAL COMPONENT

TECHNICAL FIELD

The present invention relates to a cluster jet processing method for processing the surface of a sample using a reactive cluster formed of a reactive gas, and a semiconductor element, a micro electro mechanical system element, and an optical component that are produced by a processing method using a reactive cluster.

BACKGROUND ART

As the method for processing the surface of a sample by irradiating the surface of the sample with a gas cluster, for example there is a method using a gas cluster ion beam, which removes atoms and molecules on the surface of a sample by causing a gas cluster to be ionized, and accelerated with an electrical field and/or a magnetic field to collide with the surface of the sample (for example, see Patent Document 1).

In the above-described method for processing the surface of a sample, a gas cluster composed of an aggregated atom or molecular group of a gaseous substance is formed by jetting out from a gas supplying unit a pressurized mixed gas of a substance, which is in a gaseous state at normal temperatures and under normal pressures, and a rare gas. Then, the gas cluster is ionized by irradiating the gas cluster with an electron beam, and thereby a gas cluster ion beam is formed.

If a solid surface is irradiated with this gas cluster ion beam, multiple-step collision occurs between molecular or atom species constituting cluster ions, and between the molecular or atom species constituting cluster ions and the atoms on the solid surface. Because of this, reflected atoms or molecules having lateral motion components are generated, and with these reflected atoms or molecules, flattening and cleaning of a substrate surface are enabled.

Thus, it is possible to process the surface of a sample with a gas cluster ion beam.

Also, it is proposed to provide a processing apparatus using cluster ions with i) an accelerating electrical field unit for giving acceleration voltage to cluster ions and ii) a decelerating electrical field unit for giving deceleration voltage to cluster ions, and decrease acceleration voltage to be given to cluster ions in a stepwise or continuous manner (for example, refer to Patent Document 2).

Patent Document 1: Japanese Unexamined Patent Application Publication No. H8-319105

Patent Document 2: Japanese Unexamined Patent Application Publication No. 2005-310977

DISCLOSURE OF THE INVENTION

Problems to be Solved by the Invention

However, in a hitherto known method using a gas cluster ion beam, and a hitherto known apparatus using a gas cluster ion beam, a process to ionize a gas cluster and accelerate ions with direct voltage is carried out. Therefore, the gas cluster is caused to collide with a sample, after changing cluster ions to be electrically neutral using weak ionized molecules or neutralizers.

However, with the above-described method, it is not possible to change the cluster to completely electrically neutral particles, and electrical damages to the sample cannot be completely eliminated.

Also, when making semiconductor elements, micro electro mechanical system (MEMS) elements, optical components, etc., deep boring with the aspect ratio of 1 or over, forming of a penetration hole in the substrate, and etching of a metal layer are carried out. These processes are generally carried out by plasma anisotropic etching.

However, if the above-described processes are carried out by plasma anisotropic etching, for example the characteristics such as threshold voltages, etc. of control transistors, constituted of MOS transistors, MOS capacitors, etc. already formed in the substrate, are changed. Also, for example in multi-layer wiring structure formed in a semiconductor element, permittivity of an interlayer dielectric film composed of a low-permittivity material (Low-k) is changed by plasma heat.

Also, besides plasma processing, for example, etching based on a dipping method into an etching solution is also carried out. However, in plasma processing and etching based on a dipping method, amounts of side etching, undercutting, etc. are relatively large, and it is not suitable for a miniaturized and high-density pattern.

To solve the above-described problems, the present invention provides a method for processing a sample using an electrically neutral reactive cluster. Also, the present invention provides a semiconductor element, a micro electro mechanical system element, and an optical component that are processed with anisotropic etching in which the above-described processing method has been applied.

Means for Solving the Problems

The cluster jet processing method of the present invention is characterized in that a mixed gas composed of a reactive gas and a gas having a boiling point lower than that of the reactive gas is jetted out from a gas jetting part of a vacuum process room by a pressure in a range in which the mixed gas is not liquefied, in a predetermined direction, while being adiabatically-expanded, thereby generating a reactive cluster, and the reactive cluster is jetted to a sample in the vacuum process room, thereby processing the surface of the sample.

The semiconductor element of the present invention is characterized in that it includes a semiconductor substrate etched by jetting out a mixed gas composed of a reactive gas and a gas having a boiling point lower than that of the reactive gas from a gas jetting part provided in a vacuum process room in which the semiconductor substrate is placed by a pressure in a range in which the mixed gas is not liquefied, in a predetermined direction, while adiabatically-expanding the mixed gas, thereby generating a reactive cluster and jetting the reactive cluster to the semiconductor substrate in the vacuum process room.

The micro electro mechanical system element of the present invention is characterized in that it includes a substrate processed by jetting out a mixed gas composed of a reactive gas and a gas having a boiling point lower than that of the reactive gas from a gas jetting part provided in a vacuum process room in which the substrate is placed by a pressure in a range in which the mixed gas is not liquefied, in a predetermined direction, while adiabatically-expanding the mixed gas, thereby generating a reactive cluster and jetting the reactive cluster to the substrate in the vacuum process room.

The optical component of the present invention is characterized in that it includes an optical pattern formed by jetting out a mixed gas composed of a reactive gas and a gas having a boiling point lower than that of the reactive gas from a gas jetting part provided in a vacuum process room in which the optical pattern is placed by a pressure in a range in which the mixed gas is not liquefied, in a predetermined direction, while adiabatically-expanding the mixed gas, thereby generating a reactive cluster and jetting the reactive cluster to the optical pattern in the vacuum process room.

Effects of the Invention

According to the present invention, when processing a sample, by forming a reactive cluster using a reactive gas and a gas having a boiling point lower than that of the reactive gas, the reactive cluster collides and reacts with the sample, and thereby the surface of the sample can be processed. Therefore, it is not necessary to ionize the cluster by applying an electric field or a magnetic field, and because the cluster is formed of electrically neutral particles that are not ionized, it is not necessary to electrically neutralize the cluster. Accordingly, electrical damages are not caused to the sample. Further, because sheathing is not formed, drawing of the reactive cluster to the sidewall direction is not caused, and straightness in the depth direction of anisotropic etching is improved.

Accordingly, according to the present invention, processing a sample with high straightness in the depth direction becomes possible in a condition that electrical damages to the sample are eliminated.

Also, according to the present invention, a semiconductor substrate is processed by jetting of a reactive cluster into a vacuum process room. Accordingly, it is possible to carry out high-precision anisotropic etching to the semiconductor substrate without conducting plasma anisotropic etching. Therefore, it is possible to carry out deep boring with the aspect ratio of 1 or over to a substrate and so on, without causing a change in the threshold voltage of a transistor, a change in permittivity of an interlayer dielectric film, etc., which are generally caused by plasma processing. Also, because of high-precision anisotropic etching, amounts of side etching and undercutting that are generated are very small, and high-density and miniaturized patterns can be formed. Thus, with high-precision anisotropic etching using a reactive cluster, a semiconductor element, a micro electro mechanical system element, and an optical component, each having less deviations from design values, can be provided.

BEST MODES FOR CARRYING OUT THE INVENTION

Below, description will be made with respect to a concrete embodiment of the present invention referring to drawings.

Figure 1A:
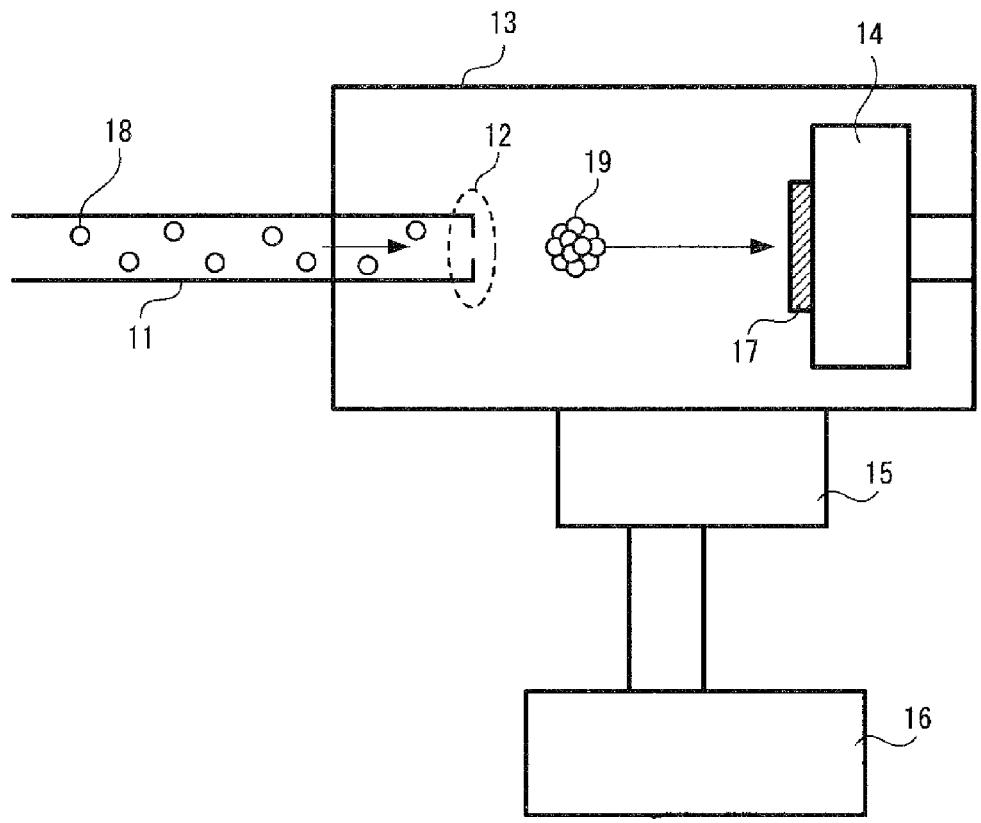
FIG. 1A, FIG. 1B, and FIG. 1C are diagrams for explaining constitution of an embodiment of a sample processing apparatus according to a processing method of the present invention.
Figure 1B:
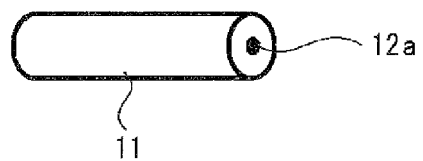
Figure 1C:
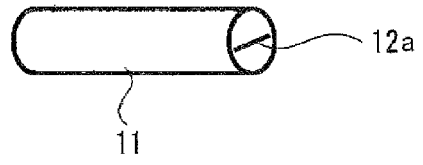

First, FIG. 1A, FIG. 1B, and FIG. 1C illustrate an embodiment of a sample processing apparatus which is applied to a processing method of the present invention.

A processing apparatus illustrated in FIG. 1A includes a vacuum process room 13, and a gas supplying unit 11 and a sample table 14 that are provided in the vacuum process room 13.

The gas supplying unit 11 is provided with a gas jetting part 12 having an aperture of a sufficiently small area for causing adiabatic expansion of gas when the gas has been jetted out. The gas jetting part 12 is provided in the vacuum process room 13.

Also, the processing apparatus is constituted such that a mixed gas, which is composed of an interhalogen compound or hydrogen halide as a reactive gas and a gas having a boiling point lower than that of the reactive gas, is supplied to the gas supplying unit 11 by a not-illustrated gas supplying means. Molecules 18 of the mixed gas filled in the gas supplying unit 11 are jetted from the gas jetting part 12, and thereby a reactive cluster 19 is formed.

The gas jetting part 12 is provided at an end of the gas supplying unit 11, and the aperture 12a of the gas jetting part 12 may be formed in a circle as illustrated in FIG. 1B or in a rectangle as illustrated in FIG. 1C. Note that the aperture 12a of the gas jetting part 12 may be in any shape as long as it is sufficiently small for obtaining a differential pressure between the gas supplying unit 11 and the vacuum process room 13 by which a reactive cluster can be formed.

In the vacuum process room 13, the gas supplying unit 11 and the sample table 14 for placing a sample 17 are arranged so as to be lined up on a straight line in a gas jetting direction from the gas jetting part 12 of the gas supplying unit 11. Further, the sample table 14 and the gas jetting part 12 are installed movably in the vacuum process room 13 by driving of a not-illustrated moving unit.

Therefore, it is possible to change the distance between the surface of the sample 17 placed on the sample table 14 and the gas jetting part 12, to change the position on the surface of the sample 17 placed on the sample table 14 the reactive cluster jetted from the gas jetting part 12 collides with, and to change the incidence angle of the reactive cluster to the surface of the sample 17 placed on the sample table 14, by moving the sample table 14 and/or the gas jetting part 12 on the straight line in the gas jetting direction, or by changing the inclination angle of the sample table 14 relative to the straight line in the gas jetting direction and/or the gas jetting direction from the gas jetting part 12.

To the vacuum process room 13 connected are a turbo molecule pump 15 and a drive pump 16, and by combining these two pumps, it is possible to depressurize the vacuum process room 13.

Next, description will be made with respect to a sample processing method using the processing apparatus illustrated in FIG. 1A, FIG. 1B and FIG. 1C, as an embodiment of a sample processing method of the present invention.

First, a mixed gas composed of an interhalogen compound or hydrogen halide as a reactive gas and a gas having a boiling point lower than that of the reactive gas is supplied to the gas supplying unit 11 using the not-illustrated gas supplying means. The pressure in the gas supplying unit 11 (primary pressure) at this time is made to the one within a range in which a reactive gas having a relatively high boiling point will not be liquefied, for example, 0.3 MPaG or above and 1.0 MPaG or below in the case of a mixed gas of 6 vol % of ClF3 and 94 vol % of Ar.

Note that for the primary pressure, PaG which is a pressure unit for atmospheric pressure is used, and for the secondary pressure, Pa which is a pressure unit for absolute pressure is used.

And, the air in the vacuum process room 13 is evacuated by the turbo molecule pump 15 and the dry pump 16, and the pressure in the vacuum process room 13 (secondary pressure) is controlled to be at 100-0.1 Pa or below, particularly preferably at 10 Pa or below. Because of the difference between the primary pressure in the gas supplying unit 11 and the secondary pressure in the vacuum process room 13, the mixed gas in the gas supplying unit 11 is jetted out from the gas jetting part 12 into the vacuum process room 13.

At this time, gas jetting from the gas jetting part 12 is carried out by the pressure difference of the primary pressure and the secondary pressure. Therefore, it is desirable to increase the difference between the primary pressure and the secondary pressure. However, because stable gas supplying cannot be made in a condition that the mixed gas has been liquefied, it is necessary that the primary pressure is in a range in which the mixed gas will not be liquefied.

Further, the kinetic energy when the mixed gas is jetted from the gas jetting part 12 becomes larger as the pressure difference of the primary pressure and the secondary pressure is larger. Therefore, as the pressure difference of the primary pressure and the secondary pressure is larger, the energy when the reactive cluster collides with a sample becomes larger, and the reactive energy to process the sample becomes larger.

At this time, the jetted mixed gas rapidly turns into a low-pressure condition from a high-pressure condition, and an electrically neutral reactive cluster is generated. The reactive cluster is formed of a cluster of generally several tens to several thousands pieces of atom or molecule constituting a reactive gas, for example an interhalogen compound or hydrogen halide, and a gas having a boiling point lower than that of the reactive gas.

As the reactive gas, it is necessary that the reactivity with the sample as the processing target is high. Therefore, when using a silicon single crystal as a sample, it is preferable to use an interhalogen compound having a relatively high reactivity with silicon. As the interhalogen compound, for example, ClF, ClF3, ClF5, BrF3, BrCl, IF5, and IF7 may be used. Particularly, it is preferable to use ClF3 having a relatively high reactivity with silicon.

Also, when using a metal material, or a semiconductor material other than silicon, for example, GaAs, InP, GaN, etc., it is preferable to use hydrogen halide having a relatively high reactivity with the metal material.

For hydrogen halide, HCl, HBr, HI, etc. may be used. In particular, it is preferable to use HI which has a relatively high reactivity with the metal material.

At this time, because the above-described reactive gas has a relatively high boiling point, if the reactive gas alone is supplied to the gas supplying unit 11, the pressure necessary for generating a reactive cluster cannot be obtained. Therefore, by mixing a gas having a low boiling point relative to the above-described reactive gas, such as an interhalogen compound or hydrogen halide, with the reactive gas, it is possible to lower the partial pressure of the above-described reactive gas. Accordingly, it is possible to obtain the primary pressure that is sufficient for generating a reactive cluster, while avoiding liquefying of the reactive gas.

As the gas having a boiling point lower that that of the reactive gas, it is possible to use a rare gas, such as He, Ar, Ne, Kr, Xe, etc., N2, CO2, O2, and so on.

Also, it is desirable that the gas with the boiling point lower than that of the reactive gas will not react with the reactive gas in the gas supplying unit 11. If the reactive gas and the gas having the boiling point lower than that of the reactive gas react with each other in the gas supplying unit 11, a reactive cluster cannot be generated in a stable manner, and it may occur that processing of a sample becomes difficult.

The generated reactive cluster is jetted from the gas jetting part 12 toward the sample 17 placed on the sample table 12 by the kinetic energy when the mixed gas is jetted out from the gas supplying unit 11. And, the reactive cluster collides with the surface of the sample 17, and thereby the kinetic energy is converted to reactive energy, and the reactive cluster reacts with the sample 17.

In particular, by using a gas having a relatively high reactivity with the sample, for example an interhalogen compound or hydrogen halide, a reaction occurs between the reactive gas and the sample at a part of the sample the reactive cluster collides with, and thereby atoms or molecules on the surface of the sample can be efficiently etched or removed. Accordingly, by using a combination of a reactive gas and a sample each having a relatively high reactivity with each other, it is possible to efficiently process the surface of the sample.

As described above, by processing a sample by jetting a reactive cluster of a reactive gas and a gas with a boiling point lower than that of the reactive gas to the sample, it is possible to process the sample without giving acceleration voltage to the cluster. Because the reactive cluster is not ionized, it is not necessary to neutralize the reactive cluster, so that electrical damages to the sample that occur when the cluster is not completely neutralized can be eliminated.

Note that description has been made above with respect to a processing apparatus in which one gas jetting part is provided for jetting a mixed gas, however, in the processing method of the present invention, the number of gas jetting parts to be provided to the processing apparatus may be plural.

By conducting processing of a sample by jetting clusters in the same direction from plural gas jetting parts, processing covering a broader range than when conducting processing using a single gas jetting part is possible, and the speed of processing the sample increases.

Also, by providing a plurality of gas jetting parts different in gas jetting directions, it becomes possible to jet clusters to the sample concurrently from the vertical direction and the diagonal direction. Also, by controlling pressures and flow volumes of the mixed gas so as to be the same or individually at the plurality of gas jetting parts, it becomes possible to control the surface conditions and the processing speed of the sample.

Further, it is possible to combine the above-described processing methods, so that it becomes possible to process more complicated forms than before, more quickly and by carrying out processing once.

Figure 17:
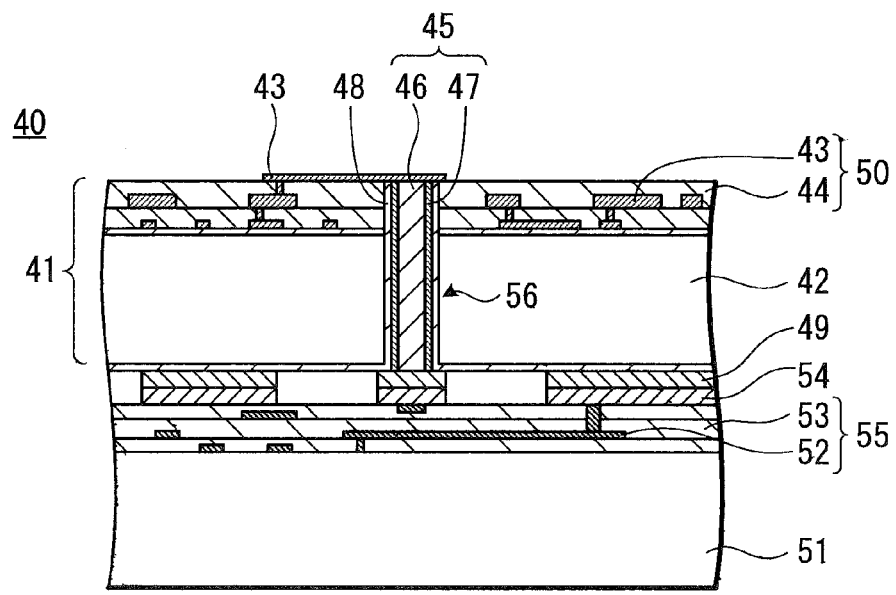
FIG. 17 is a diagram illustrating a rough constitution of an embodiment of a semiconductor element of the present invention.

Next, description will be made with respect to an embodiment of a semiconductor element of the present invention, which can be produced using the above-described cluster jet processing method. FIG. 17 illustrates a rough constitution of an embodiment of a semiconductor element of the present embodiment.

A semiconductor element 40 shown in FIG. 17 includes a base 51, and a semiconductor chip 41 mounted on the base 51.

The semiconductor chip 41 includes; a multi-layered wiring layer 50 composed of a wiring layer 43 and an inter-layer insulating layer 44 and formed on one principal surface of a semiconductor substrate 42; an electrode pad 49 for connection formed on the other principal surface of the semiconductor substrate 42; and a penetration electrode 45 formed so as to penetrate through the semiconductor substrate 42.

On the base 51 formed are; a multi-layered wiring layer 55 composed of a wiring layer 52 and an inter-layer insulating layer 53 and formed on one principal surface of the base 51; and an electrode pad 54 for connection.

The electrode pad 54 formed on the base 51 and the electrode pad 49 formed on the semiconductor substrate 42 are connected with each other, and thereby the semiconductor chip 41 is mounted on the base 51.

The penetration electrode 45 formed in the semiconductor chip 41 is formed of an embedded conductive layer 46 formed in a hole 56 that is formed by etching using the above-described processing method with a reactive cluster.

The penetration hole 56 provided in the semiconductor substrate 42 is formed by the above-described sample processing method using a reactive cluster.

The penetration electrode 45 includes an insulating layer 48 formed on the sidewall of the hole 56 provided in the semiconductor substrate 42. A barrier metal layer 47 is formed along this sidewall on the insulating layer 48.

When forming the wiring layer 43 formed in the semiconductor chip 41 and the wiring layer 52 formed in the base 51 by a subtractive method for example, first a conductive body layer, which will be a wiring layer, is formed over the entire surface of the insulating layer, thereafter wiring patterns are formed with a photoresist, etc., and then the conductive body layer is etched, and thereby a wiring layer having a desired pattern is formed.

For etching of the conductive body layer, the above-described sample processing method using a reactive cluster can be used. With etching using the above-described processing method using a reactive cluster, strongly anisotropic etching is possible, so that there will be no influence of wiring thinning due to side etching, undercutting, etc. occurring in the hitherto known subtractive method, and wiring miniaturization is possible in design rules. Accordingly, by using the above-described sample processing method using a reactive cluster, high-density wiring is possible when using the subtractive method, too.

Note that the semiconductor substrate 42 may include a penetration hole formed by a method other than the above-described method, however, at least one or more penetration holes are formed by etching using the above-described processing method using a reactive cluster. Also, it is preferable that the above-described wiring layer is formed by etching using the above-described processing method using a reactive cluster, however, etching may be conducted by other methods than that.

Thus, in the above-described semiconductor element, it will be sufficient if either one or more of the holes or wirings provided in the semiconductor element are formed by the above-described processing using a reactive cluster, and further, the holes and/or wirings may include those formed by other processing methods, in addition to the one or more holes or wirings formed by the above-described processing using a reactive cluster.

Next, description will be made with respect to an embodiment of the method of producing a semiconductor element of the present invention.

Figure 18A:
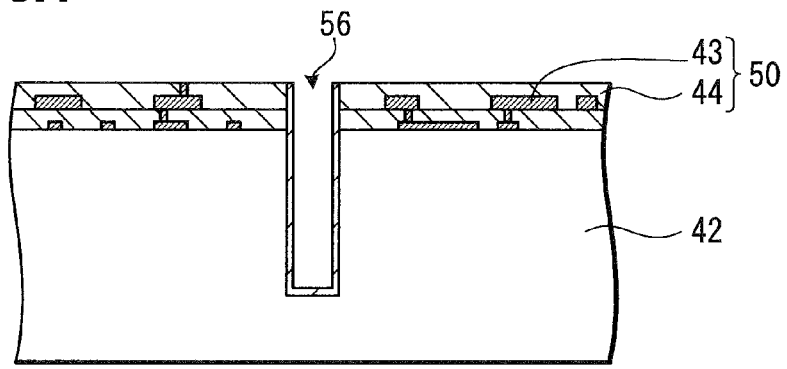
FIG. 18A, FIG. 18B, and FIG. 18C are diagrams of production processes of an embodiment of a semiconductor element of the present invention.

First, as illustrated in FIG. 18A, the wiring layer 43 and the inter-layer insulating layer 44 are laminated on one principal surface side of the semiconductor substrate 42, and thereby the multi-layered wiring layer 50 is formed. And, the hole 56 is formed in the semiconductor substrate 42 on which the multi-layered wiring layer 50 has been formed, from the multi-layered wiring layer 50 side. The hole 56 is formed to penetrate through the multi-layered wiring layer 50 and halfway in the thickness direction of the semiconductor substrate 42. And, in the hole 56 thus formed, the insulating layer 48 is formed using, for example, a thermal oxidation method, a CVD (Chemical Vapor Deposition) method, etc.

The above-described processing method using a reactive cluster is applied to the above-described formation of the hole 56.

First, for example, by photolithography, a pattern mask of a photoresist, which is opened only at a part where the hole 56 is formed in the semiconductor substrate 42, is formed, and etching of the hole 56 is carried out. The above-described sample processing method using a reactive cluster is used for this etching. For example, in the processing apparatus shown in FIG. 1, the semiconductor substrate 42 is placed on the sample table, and a mixed gas of a reactive gas and a gas with a boiling point lower than that of the reactive gas is jetted out from the gas jetting part. Thereby, a reactive cluster is generated, and the semiconductor substrate 42 placed on the sample table is etched. When using a silicon substrate for the semiconductor substrate 42, it is preferable to use a mixed gas of a ClF3 gas that has high reactive property to the silicon substrate and an argon gas.

In formation of the wiring layer 43 on the semiconductor substrate 42, for example when using the subtractive method, a conductive body layer, which will be a wiring layer, is formed over the entire surface of the insulating layer, and a wiring pattern mask of a photoresist, etc. is formed. Then, by etching the conductive body layer using the mask, the wiring layer 43 with a desired pattern is formed.

With etching using the above-described processing method using a reactive cluster, strongly anisotropic etching is possible. Accordingly, by such etching using the above-described processing method using a reactive cluster, deep boring processing with the aspect ratio of 1 or over can be precisely carried out, and it is possible to form the precise hole 56 in the semiconductor substrate 42. Also, by carrying out patterning of the wiring layer 43 using the processing method using a reactive cluster, thinning of wirings due to side etching, undercutting, etc. of the conductive body layer, and so on do not occur, and miniaturization of wiring in design rules and high-density wirings become possible.

Figure 18B:
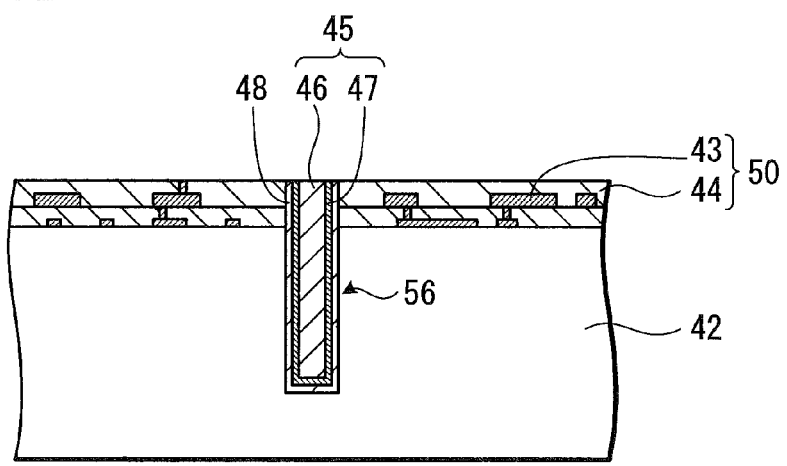

Next, as illustrated in FIG. 18B, the barrier metal layer 47 and the embedded conductive layer 46 are formed in the hole 56.

First, using a sputtering method or a CVD method, the barrier metal layer 47 composed of TiN, WN, Ti, TaN, Ta, etc. is formed on the entire surface of the semiconductor substrate 42 including the hole 56. Then, a conductive body layer composed of Cu, Al, Ti, Sn, etc. is formed on the barrier metal layer 47. Then, using a CMP (Chemical Mechanical Polishing) method, etc., the conductive body layer and the barrier metal layer 47 formed on the semiconductor substrate 42 except the hole 46 are removed, and thereby the barrier metal layer 47 and the embedded conductive layer 46 are formed in the hole 56.

Also, flattening of the substrate may be carried out using, in place of the CMP method, the above-described processing method using a reactive cluster. For example, in the processing apparatus shown in FIG. 1, the semiconductor substrate 42 is placed on the sample table, and a mixed gas of a reactive gas and a gas with a boiling point lower than that of the reactive gas is jetted out from the gas jetting part. At this time, by moving the sample table, it is possible to jet the reactive cluster to the entire surface of the sample, and thereby the surface of the sample can be flattened. Thus, by generating a reactive cluster, the conductive body layer and the barrier metal layer 47 formed on the semiconductor substrate 42 are etched. For the reactive gas, it is preferable to use a gas, such as HCl, HBr, HI, etc., that has high reactivity with a metal used for the conductive body layer or barrier metal layer 47.

Figure 18C:
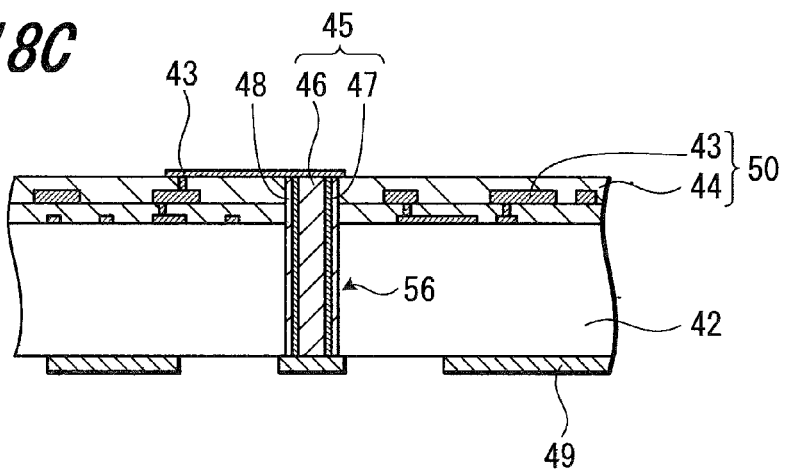

Next, as illustrated in FIG. 18C, by exposing the embedded conductive layer 46 from both principal surfaces of the semiconductor substrate 42, the penetration electrode 45 is formed, and then the wiring layer 43 and the electrode pad 49, which are connecting with the penetration electrode 45, respectively, are formed.

First, the surface of the semiconductor substrate 42 on which the multi-layered wiring layer 50 has not been formed is etched by the CMP method or by etching using the above-described processing method using a reactive cluster. With this etching, the embedded conductive layer 46 is exposed from the semiconductor substrate 42. Thus, by exposing the embedded conductive layer 46 from the both principal surfaces of the semiconductor substrate 42, the penetration electrode 45 is formed.

Then, by the same method as used above for the wiring layer 43 of the multi-layered wiring layer 50, the wiring layer 43 connecting with the penetration electrode 45 is formed on the multi-layered wiring layer 50. Also, the electrode pad 49 connecting with the penetration electrode 45 is formed on the other surface of the semiconductor substrate 42.

With the above-described processes, the semiconductor chip 41 can be formed. And, by connecting the electrode pad 49 of the semiconductor chip 41 with the electrode pad 54 of the base 51, the semiconductor element 40 shown in FIG. 17 can be produced.

Note that the base 51 can be produced by the same method as the above-described method of producing the semiconductor chip 41 except the processes of forming the hole 56 and the penetration electrode 45. The base 51 can be produced by other known methods, too.

Next, description will be made with respect to an embodiment of a micro electro mechanical system (MEMS) element of the present invention, which can be produced by the above-described cluster jet processing method.

Figure 19:
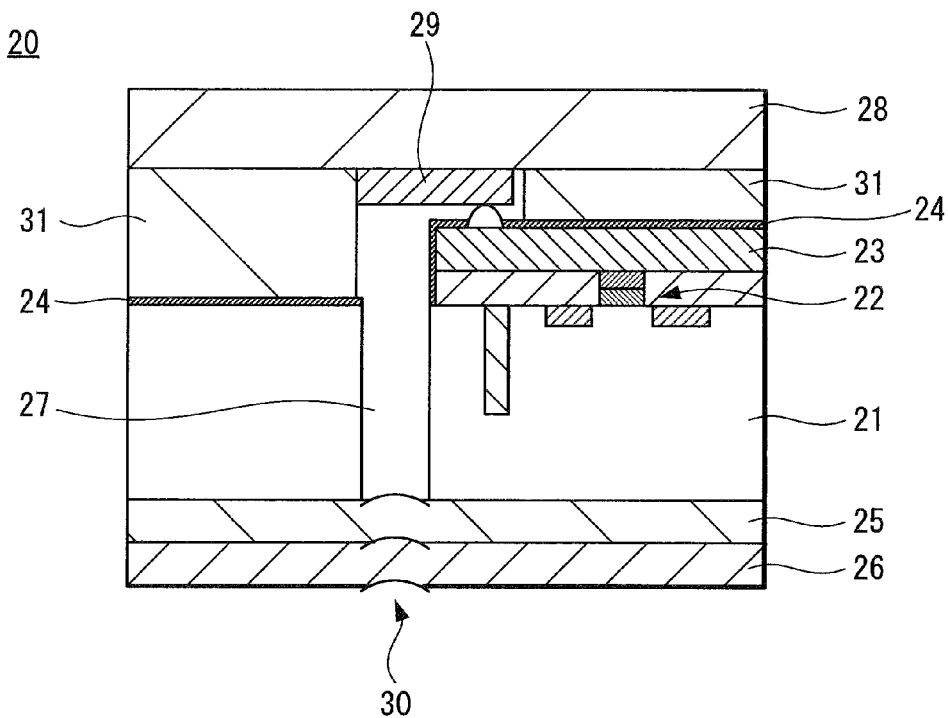
FIG. 19 is a diagram illustrating rough constitution of an embodiment of a pressure sensor of the present invention.

FIG. 19 illustrates a rough constitution of a pressure sensor as an embodiment of the MEMS element.

A pressure sensor 20 shown in FIG. 19 includes a controller-integrated MEMS sensor formed on a semiconductor substrate 21.

On one principal surface of the semiconductor substrate 21 formed is a MEMS sensor controller 22 composed of a MOS (metal oxide semiconductor) transistor and a MOS capacitor. Further, a low-k wiring 23 made of low-dielectric constant material (low-k), which is connected with the MEMS sensor controller 22, is formed. On the semiconductor substrate 21 and the low-k wiring 23, an insulating passivation film 24 is formed.

On the surface of the semiconductor substrate 21 on which the MEMS sensor controller 22 has been formed, a vacuum cover glass 28 is attached. A capacitor and controller wiring 29 is provided to the surface of the vacuum cover glass 28 on the side of the semiconductor substrate 21. The capacitor and controller wiring 29 is connected with the MEMS sensor controller 22 through the low-k wiring 23. The vacuum cover glass 28 adheres on the passivation film 24 of the semiconductor substrate 21 by an adhesive layer 31.

Also, a spin on glass (SOG) insulation layer 25 is formed on the other principal surface of the semiconductor substrate 21. And, on the SOG insulation layer 25, an electrode 26 composed of Ni, etc. is formed.

In the above-described semiconductor substrate 21, a pressure reference vacuum 27 composed of a hole penetrating through the both principal surfaces of the substrate 21 and having the aspect ratio of 1 or over is formed. The pressure reference vacuum 27 of the semiconductor substrate 21 is formed by the above-described sample processing method using a reactive cluster. And, by forming the pressure reference vacuum 27 in the semiconductor substrate 21, a membrane construction 30 by a SOG insulating layer 25 and an electrode layer 26 at a part contacting the pressure reference vacuum 27 is formed in the pressure sensor 20. The capacitor and controller wiring 29 of the vacuum cover glass 28 is formed at a position opposing the membrane construction 30 through the semiconductor substrate 21.

Next, description will be made with respect to the method of producing the above-described pressure sensor 20.

First, on one principal surface side of the semiconductor substrate 21, the MEMS sensor controller 22 is formed. The MEMS sensor controller 22 can be produced by the same method as used for known MOS transistors and MOS capacitors. Further, on the MEMS sensor controller 22, using low-k material, the low-k wiring 23 for the MEMS sensor controller 22 is formed. Then, the passivation film 24 covering the semiconductor substrate 21, the MEMS sensor controller 22, and the low-k wiring 23 is formed.

Also, on the other principal surface side of the semiconductor substrate 21, the SOG insulating layer 25 is formed by a spin coat method, etc. And, the electrode 26 is formed on the SOG insulating layer 25, for example by Ni plating, etc.

Figure 20:
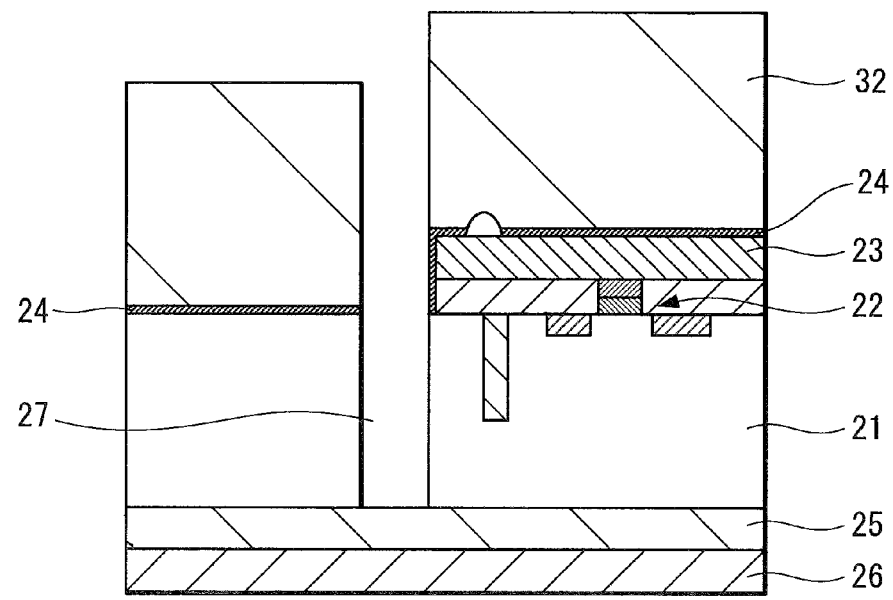
FIG. 20 is a diagram explaining a production process of an embodiment of a pressure sensor of the present invention.

Next, as shown in FIG. 20, by lithography, a pattern mask by means of a photoresist 32, which is opened only at a part where the pressure reference vacuum 27 is formed in the semiconductor substrate 21, is formed.

And, using the photoresist 32 as a mask, the semiconductor substrate 21 is etched. For this etching, the above-described sample processing method using a reactive cluster is used. For example, in the processing apparatus shown in FIG. 1, the semiconductor substrate 21 is placed on the sample table, and a mixed gas of a reactive gas and a gas having a boiling point lower than that of the reactive gas is jetted out from the gas jetting part. Thereby, a reactive cluster is generated, and the semiconductor substrate 21 is etched. When using a silicon substrate for the semiconductor substrate 21, it is preferable to use a mixed gas of a ClF3 gas having relatively high reactivity with the silicon substrate and an argon gas.

With such etching using the processing method using a reactive cluster, it is possible to carry out deep boring processing with the aspect ratio of 1 or over only to a part of the semiconductor substrate 21 where the pressure reference vacuum 27 is formed.

Further, after forming a hole which will be the pressure reference vacuum 27, in the vacuum process room in which etching has been carried out, the vacuum cover glass 28 is attached on the passivation film 24 of the semiconductor substrate 21 using the adhesive layer 31. The vacuum cover glass 28 is provided with the capacitor and controller wiring 29 in advance. And, the vacuum cover glass 28 is attached to the semiconductor substrate 21 such that the capacitor and controller wiring 29 is connected with the low-k wiring 23.

With the above-described processes, the controller-integrated type pressure sensor shown in FIG. 19 can be produced.

According to the above-described production method, because a reactive cluster is used in the etching process of the semiconductor substrate 21, plasma anisotropic etching is not carried out. Accordingly, even when the MEMS sensor controller 22 which is generally weak against plasma damaging is formed on the semiconductor substrate 21 before the etching process, influence due to plasma heat will not be given to the characteristics specified by design values such as the threshold voltage, etc. Also, it is possible to eliminate changes in the dielectric constant of the low-k inter-layer insulating film, which may be caused by plasma heat. Accordingly, it is possible to produce on a substrate a controller-integrated MEMS sensor in which deviation from design values is relatively small.

Figure 21A:
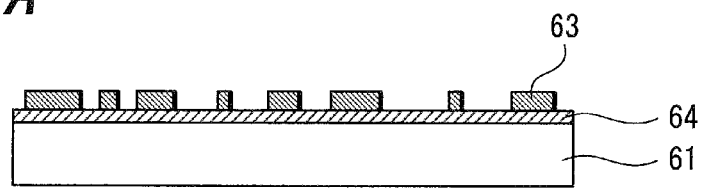
FIG. 21A is a production process diagram of an embodiment of an optical component of the present invention.
Figure 21B:
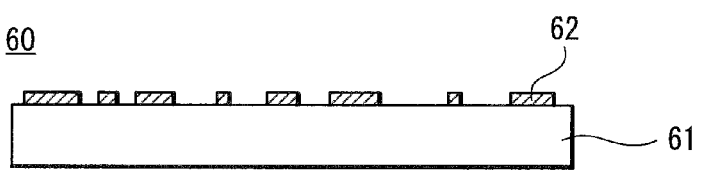
FIG. 21B is a schematic constitution diagram of an embodiment of an optical component of the present invention.

Next, description will be made with respect to an embodiment of an optical component of the present invention, which can be produced using the above-described cluster jet processing method. FIG. 21A illustrates a production process diagram of a photomask, and FIG. 21B illustrates a schematic constitution diagram of a photomask produced using the above-described processing method using a reactive cluster.

As illustrated in FIG. 21A, on the entire surface of a quartz substrate 61, a metal film 64 of Mo, Ta, Cr, etc., which will serve as a light shielding layer, is formed. Then, on the metal film 64, for example by photolithography, a photoresist pattern is formed only at a part where the light shielding layer is formed.

Next, using the photoresist pattern thus formed as the mask, the metal film 64 is etched by the above-described sample processing method using a reactive cluster. For example, in the processing apparatus shown in FIG. 1, the quartz substrate 61 is placed on the sample table, and a mixed gas of a reactive gas and a gas with a boiling point lower than that of the reactive gas is jetted out from the gas jetting part. Thereby, a reactive cluster is generated, and the metal film 64 on the quartz substrate 61 is etched. It is preferable to use such gas as HCl, HBr, HI, etc. that has relatively high reactivity with the metal used for the metal film 64.

After etching the metal film 64 using the reactive cluster, the photoresist is removed. With the above-described processes, as illustrated in FIG. 21B, a photomask, which is provided with an optical pattern composed of the light shielding layer 62, is produced on the quartz substrate 61.

Figure 22A:
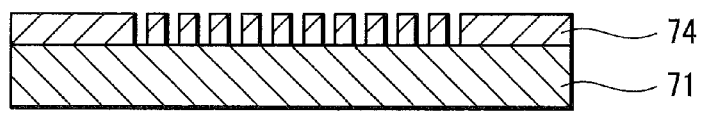
FIG. 22A is a production process diagram of an embodiment of an optical component of the present invention.
Figure 22B:
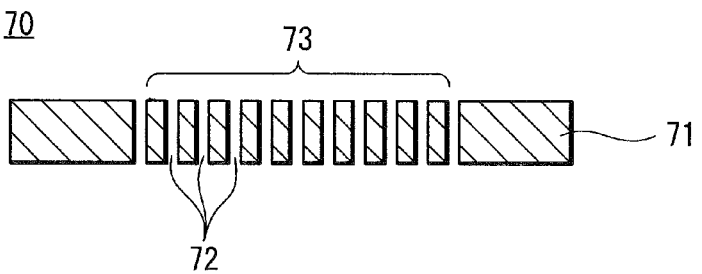
FIG. 22B is a schematic constitution diagram of an embodiment of an optical component of the present invention.

Next, as another embodiment of the optical component of the present invention, an optical slit is described. FIG. 22A illustrates a production process diagram of an optical slit of the present embodiment, and FIG. 22B illustrates a schematic constitution diagram of an optical slit produced by the processing method using a reactive cluster.

As illustrated in FIG. 22A, a photoresist pattern is formed, for example by photolithography, on a silicon substrate 71 excluding a part where a hole for forming a slit is formed.

Next, using the photoresist pattern thus formed for the mask, the silicon substrate 71 is etched by the above-described sample processing method using a reactive cluster. For example, in the processing apparatus shown in FIG. 1, the silicon substrate 71 is placed on the sample table, and a mixed gas of a reactive gas and a gas with a boiling point lower than that of the reactive gas is jetted out from the gas jetting part. Thereby, a reactive cluster is generated, and the silicon substrate 71 is etched. In etching of the silicon substrate 71, it is preferable to use a mixed gas of a ClF3 gas having relatively high reactivity with the silicon substrate 71 and an argon gas.

Then, after etching the silicon substrate 71 using the reactivity, the photoresist is removed.

With the above-described processes, as illustrated in FIG. 22B, holes 72 can be formed in the silicon substrate 71. Also, a slit 73 is formed by the holes 72 formed by etching and the remaining silicon substrate 71.

Thus, with the above-described production method, as illustrated in FIG. 22B, an optical slit 70 with an optical pattern composed of the slit 73 can be formed.

In optical components such as the above-described photomask and optical slit, by forming an optical pattern, such as a light shielding layer, an optical slit, etc., using a reactive cluster, etching of a strongly anisotropic optical pattern is possible. Therefore, because of such etching using a reactive cluster, lowering of pattern precision due to side etching, undercutting, etc. will not occur when forming an optical pattern, and miniaturization and high density of an optical pattern become possible.

Next, results of actually processing a sample by a processing method using a cluster jet according to the above-described embodiment is described below.

Figure 2:
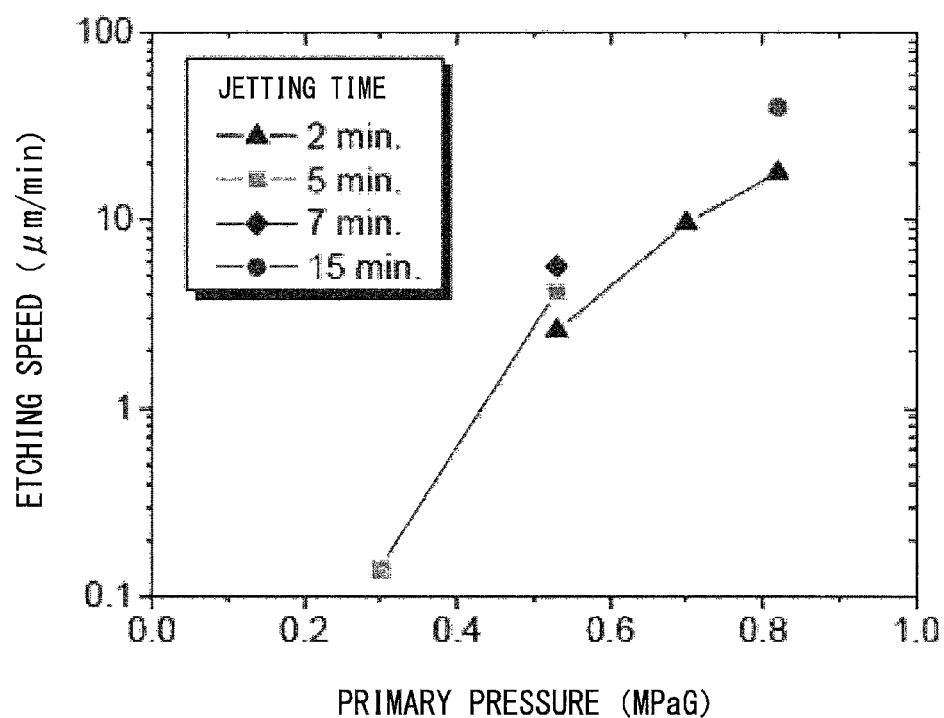
FIG. 2 is a diagram illustrating a relationship among a primary pressure, a gas jetting time to a sample, and an etching speed of the sample, in the processing method of the present invention.

First, the surface of a sample is processed while changing the jetting time of a mixed gas to be jetted to the sample and the primary pressure in the gas supplying unit. FIG. 2 shows a relationship of the primary pressure, the gas jetting time to the sample, and the sample etching speed, in such processing.

The processing conditions were as follows: As the sample, a silicon single crystal with a natural oxidized film about 2 nm thick formed on the surface thereof was used, and a mixed gas of a ClF3 gas 6 vol % as the reactive gas and an Ar gas 94 vol % as the gas with a boiling point lower than that of the reactive gas was used. The diameter of the aperture of the gas jetting part was 0.1 mm. The primary pressure was changed as shown in FIG. 2, and the gas jetting time was changed from 2 min to 5, 7, 15 min.

From the result shown in FIG. 2, it is understood that under the condition of the same gas jetting time, by increasing the primary pressure, the sample etching speed increases. By increasing the primary pressure and thereby increasing the difference from the secondary pressure, it is possible to increase the kinetic energy of an occurring reactive cluster, and thereby it is possible to increase the reactive energy occurring by collision of the reactive cluster and the sample. Therefore, the etching speed can be increased.

Figure 3:
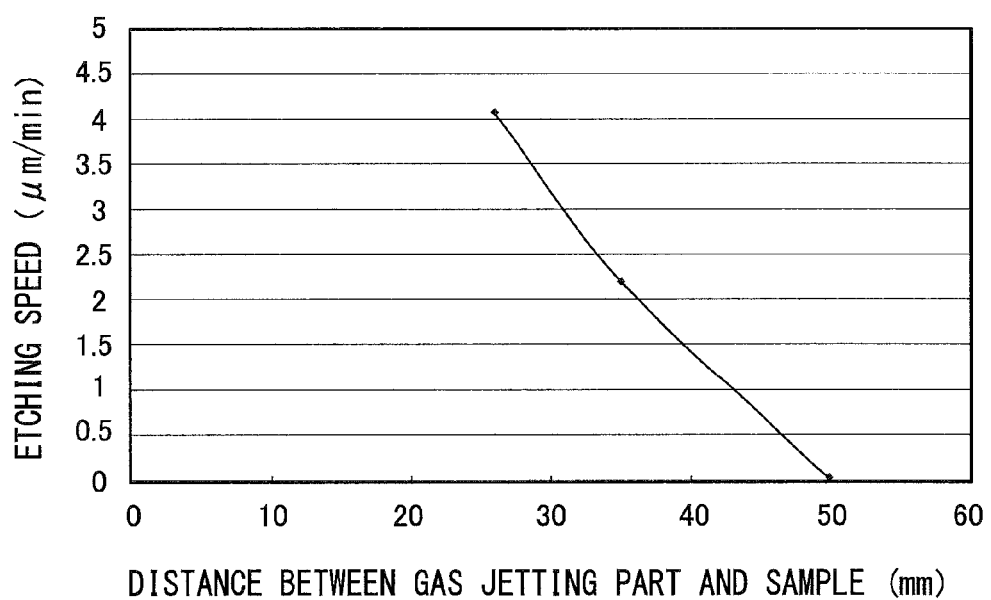
FIG. 3 is a diagram illustrating a relationship between a distance between a gas jetting part and the surface of a sample and an etching speed of the sample by processing, in the processing method of the present invention.
Figure 4:
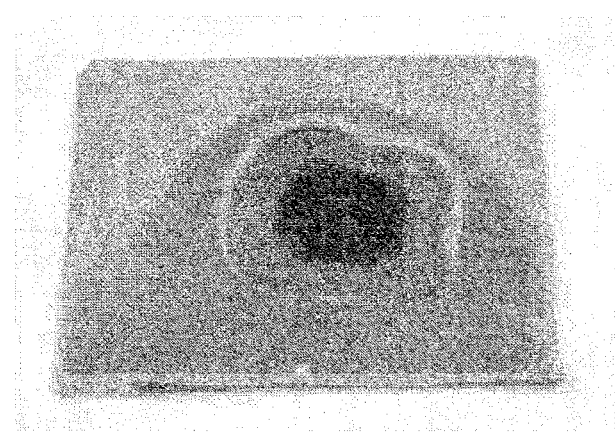
FIG. 4 is a photograph showing a condition of the surface of the sample after processing when processing has been carried out in the processing method of the present invention with the distance between the gas jetting part and the surface of the sample set to 26 mm.
Figure 5:
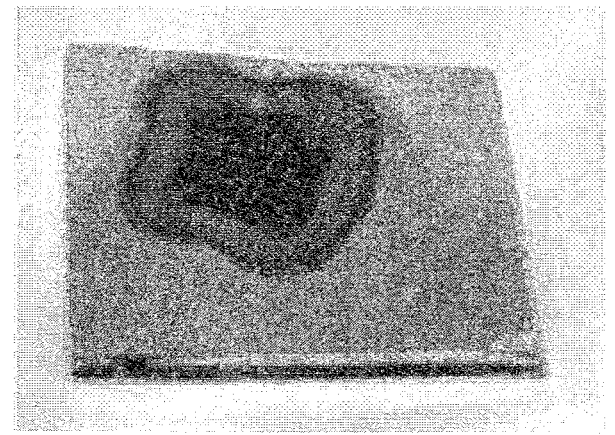
FIG. 5 is a photograph showing a condition of the surface of the sample after processing when processing has been carried out in the processing method of the present invention with the distance between the gas jetting part and the surface of the sample set to 35 mm.

Next, in the processing apparatus shown in FIG. 1, processing of the surface of the sample was carried out while changing the distance between the gas jetting part and the surface of the sample from 26 mm to 35 mm, 50 mm. FIG. 3 illustrates a relationship between the distance between the gas jetting part and the surface of the sample and the sample etching speed by such processing. FIG. 4 shows a photograph showing a condition of the surface of the sample after carrying out processing with the distance between the gas jetting part and the surface of the sample set at 26 mm, and FIG. 5 shows a photograph showing a condition of the surface of the sample after carrying out processing with the distance between the gas jetting part and the surface of the sample set at 35 mm.

The sample processing conditions were as follows: As the sample, a silicon single crystal was used, and a mixed gas of a ClF3 gas 6 vol % as the reactive gas and an Ar gas 94 vol % as the gas with a boiling point lower than that of the reactive gas was used. The jetting time of the mixed gas to the sample was 5 min, the flow volume of the mixed gas was 398 sccm, the primary pressure was 0.53 MPaG, the secondary pressure was 3.2 Pa, and the temperature within the vacuum process room was 28° C.

As shown in FIG. 3, when the distance between the gas jetting part and the surface of the sample was 26 mm, the etching speed of about 4.1 μm/min was obtained. When the distance between the gas jetting part and the surface of the sample was 35 mm, the etching speed of about 2.2 μm/min was obtained. When the gas jetting part and the surface of the sample were separated from each other 50 mm or more, the etching speed was almost 0.

When the distance between the gas jetting part and the surface of the sample is 26 mm, the etching speed that is twice as fast as when the distance is 35 mm was obtained.

From the above-described result, it is understood that by bringing the gas jetting part and the sample closer to each other, the sample etching speed increases.

Also, because the sample etching speed changes depending on the distance between the gas jetting part and the surface of the sample, by changing the distance between the gas jetting part and the surface of the sample, the sample etching speed can be changed.

Figure 6:
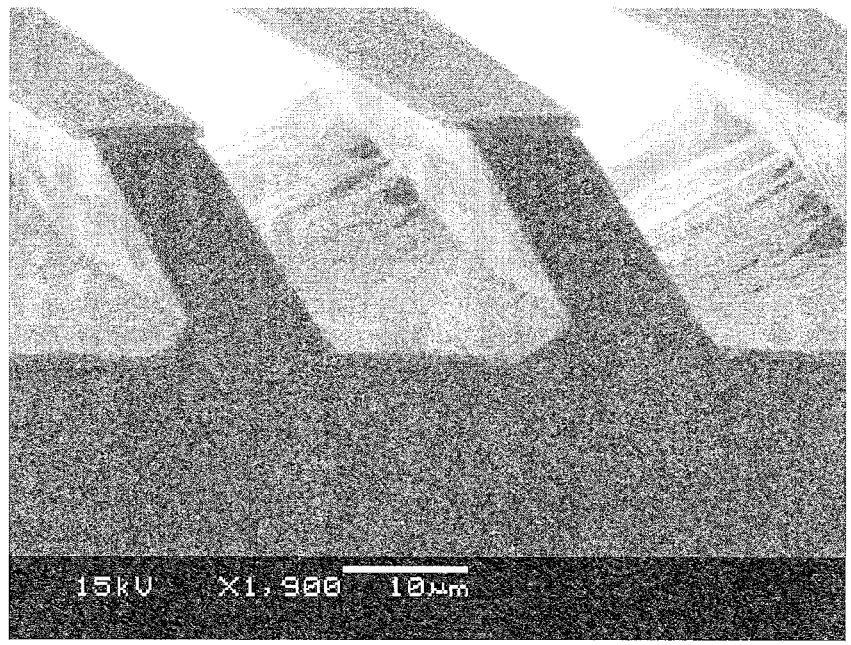
FIG. 6 is a photograph of a cross section in the vicinity of the surface of the sample after processing when processing of the surface of the sample has been carried out in the processing method of the present invention with the angle of incidence of the reactive cluster set in an oblique direction relative to the surface of the sample.

Next, processing of the surface of the sample was carried out with the incidence angle of the cluster relative to the surface of the sample put in an oblique direction by inclining the sample table. For the sample, a silicon single crystal was used, and a line-and-space pattern was formed on the surface thereof by a photoresist layer 1.2 μm thick. FIG. 6 shows a photograph of a section in the vicinity of the processed surface of the sample.

The sample processing conditions were as follows: The distance between the gas jetting part and the surface of the sample was 26 mm. A mixed gas of a ClF3 gas 6 vol % as the reactive gas and an Ar gas 94 vol % as the gas with a boiling point lower than that of the reactive gas was used. The jetting time of the mixed gas to the sample was 5 min, the flow volume of the mixed gas was 398 sccm, the primary pressure was 0.53 MPaG, the secondary pressure was 3.2 Pa, and the temperature within the vacuum process room was 28° C.

As illustrated in FIG. 6, the sample is obliquely etched in accordance with the oblique incidence direction of the reactive cluster to the surface of the sample. By thus making the incidence direction of the reactive cluster to the surface of the sample oblique relative to the surface of the sample, highly straight etching corresponding to the incidence angle is possible.

Also, utilizing the relationship as described above that the sample etching speed changes as the distance between the gas jetting part and the surface of the sample is changed, when processing the surface of a sample from the oblique direction, the gas jetting part or the sample is moved in a condition that the distance between the surface of the sample and the gas jetting part is held constant. Thereby, a protrusion part on the surface of the sample is etched on a priority basis. Accordingly, it is possible to decrease difference in level on the surface of the sample and flatten the surface of the sample.

Also, as shown in FIG. 6, the photoresist layer formed on the surface of the sample was hardly etched, and the etching selection ratio of the silicon single crystal and the photoresist was 100:1 or more. Accordingly, after forming a pattern using the photoresist mask, it is possible to selectively process the silicon single crystal according to the pattern.

Next, processing to cause a sample to be penetrated by jetting a reactive cluster to the sample was carried out.

Figure 7:
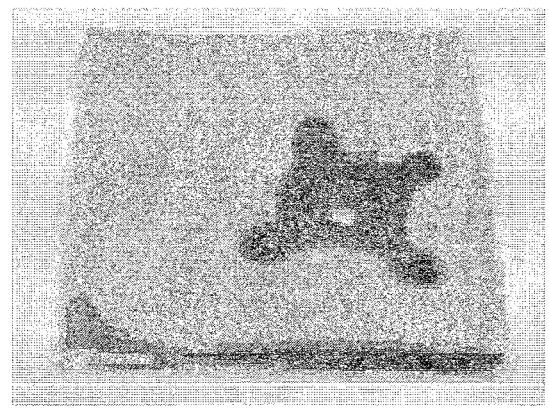
FIG. 7 is a photograph of a condition of a silicon single crystal in which a penetration hole has been formed in the processing method of the present invention.

A penetration hole was formed by jetting of a reactive cluster to the sample. FIG. 7 shows a photograph showing a condition of a silicon single crystal in which a penetration hole has been formed.

The sample processing conditions were as follows: The distance between the gas jetting part and the surface of the sample was 26 mm. As the sample, a silicon single crystal 625 μm thick was used, and a mixed gas of a ClF3 gas 6 vol % as the reactive gas and an Ar gas 94 vol % as the gas with a boiling point lower than that of the reactive gas was used. The jetting time of the mixed gas to the sample was 15 min, the flow volume of the mixed gas was 585 sccm, the primary pressure was 0.8 MPaG, the secondary pressure was 7.5 Pa, and the temperature within the vacuum process room was 25.4° C.

As shown in FIG. 7, with the above-described processing, a penetration hole was formed in the silicon single crystal 625 µm thick. Because the penetration hole was formed in the silicon single crystal 625 µm thick by the jetting time of the reactive cluster within 15 min, the etching speed under the above-described processing conditions is 41 µm/min or above.

From the above-described processing result, it is possible to form a penetration hole in a sample by jetting a reactive cluster of a reactive gas and a gas with a boiling point lower than that of the reactive gas to the sample. Therefore, for example, in a silicon material, it becomes possible to form a scribe line, and to cut a substrate at a formed scribe line. Further, using the good etching selectivity with the photoresist, it becomes possible to form an arbitrary pattern on a sample with a photoresist mask to form a scribe line other than the straight line, and to cut a substrate at a formed scribe line.

Figure 8:
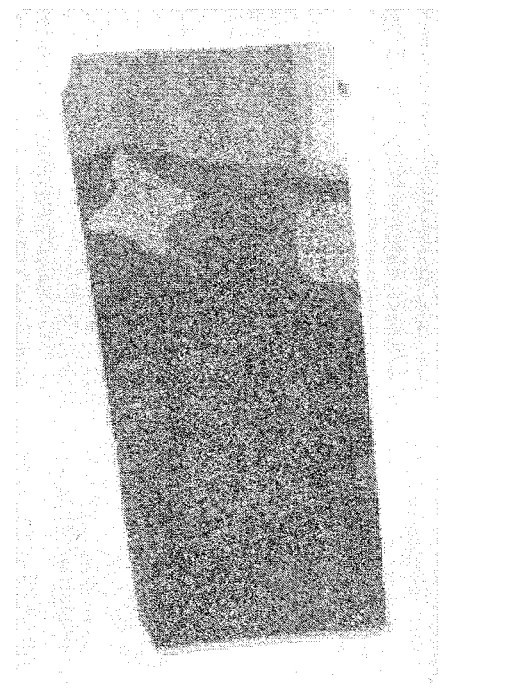
FIG. 8 is a photograph showing a condition of the surface of the sample after processing when processing of the surface of the sample has been carried out using a ClF3 gas alone.

Next, processing of the surface of the sample (silicon single crystal) was carried out using a ClF3 gas by itself in place of a mixed gas in the gas supplying part. FIG. 8 shows a photograph showing a condition of the processed surface of the sample.

The sample processing conditions were as follows: The distance between the gas jetting part and the surface of the sample was 26 mm, the jetting time of the ClF3 gas to the sample was 15 min, the flow volume of the ClF3 gas was 300 sccm, the primary pressure was 0.05 MPaG, the secondary pressure was 2.2 Pa, and the temperature within the vacuum process room was 29° C.

As shown in FIG. 8, although a processing mark by the reactive cluster is formed on the surface of the sample, the surface of the sample can be hardly etched in the gas jetting time of 15 min, and the etching speed under the above-described conditions was 0.01 µm/min or below.

Thus, because a ClF3 gas has a high boiling point and is liquefied under high pressure, when a ClF3 gas is used by itself, in processing of the sample, the primary pressure cannot be increased, so that it is not possible to increase the difference between the primary pressure and the secondary pressure. Accordingly, sufficient adiabatic expansion for generating a reactive cluster cannot be obtained.

Thus, it has been proved that by increasing the primary pressure by mixing a reactive gas with a gas with a boiling point lower than that of the reactive gas, a cluster of a mixed gas which is jetted out from the gas jetting part is sufficiently generated, and the surface of the sample is efficiently processed by the cluster.

Figure 9:
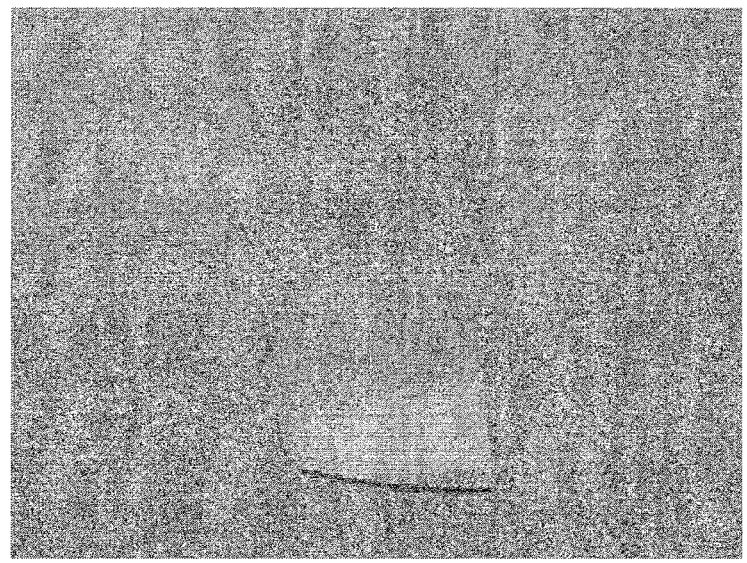
FIG. 9 is a photograph showing a condition of the surface of the sample after processing when processing of the surface of the sample has been carried out using an Ar gas alone.

Next, processing of the surface of the sample (silicon single crystal) was carried out using an Ar gas alone in place of a mixed gas. FIG. 9 shows a photograph showing a condition of the processed surface of the sample.

The sample processing conditions were as follows: The distance between the gas jetting part and the surface of the sample was 26 mm, the jetting time of the Ar gas to the sample was 15 min, the flow volume of the Ar gas was 637 sccm, the primary pressure was 0.8 MPaG, the secondary pressure was 8.6 Pa, and the temperature within the vacuum process room was 21.1° C.

As shown in FIG. 9, with the processing using an Ar gas, no change has been seen on the surface of the sample. Thus, it is understood that processing using an Ar gas alone cannot process a silicon single crystal.

Accordingly, it has been proved that processing of the surface of the sample can be carried out by using, as a mixed gas, a reactive gas and a gas with a boiling point lower than that of the reactive gas.

Figure 10:
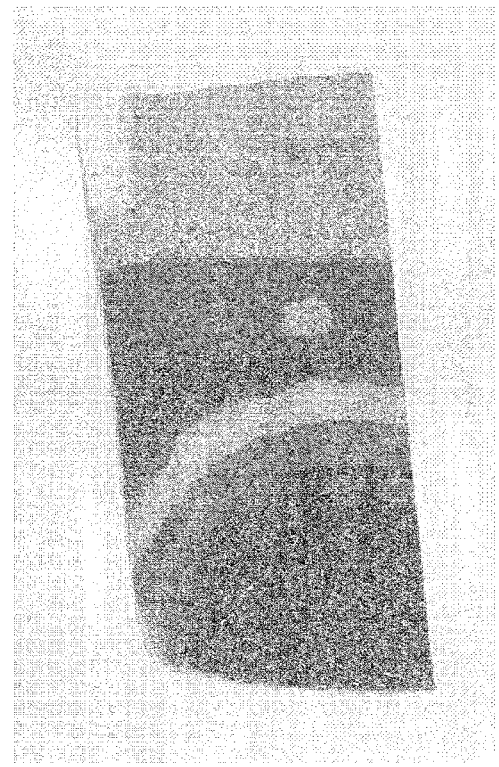
FIG. 10 is a photograph showing a condition of the surface of the sample after processing when processing of the surface of the sample has been carried out with the primary pressure set at −0.09 MPaG.

Next, processing of the surface of the sample (silicon single crystal) was carried out with the diameter of the aperture of the gas jetting part enlarged to 6 mm and the primary pressure set at −0.09 MPaG. FIG. 10 shows a photograph showing a condition of the surface of the sample after processing.

The sample processing conditions were as follows: The distance between the gas jetting part and the surface of the sample was 26 mm, a mixed gas composed of a ClF3 gas 6 vol % as the reactive gas and an Ar gas 94 vol % as the gas with a boiling point lower than that of the reactive gas was used. The jetting time of the mixed gas to the sample was 15 min, the flow volume of the mixed gas was 580 sccm, the secondary pressure was 7.5 Pa, and the temperature within the vacuum process room was 25.4° C.

Under the above-described conditions, the aperture of the gas jetting part was enlarged to 6 mm to decrease the primary pressure, and thereby the difference from the secondary pressured was made smaller. As a result, as illustrated in FIG. 10, the processing mark was not formed on the surface of the sample.

From this result, it is believed that under the above-described processing conditions, because the primary pressure is too low, the cluster of the mixed gas was not effectively formed. Also, from this result, it can be said that for generation of a reactive cluster, a pressure difference between the primary pressure and the secondary pressure is necessary.

Figure 11:
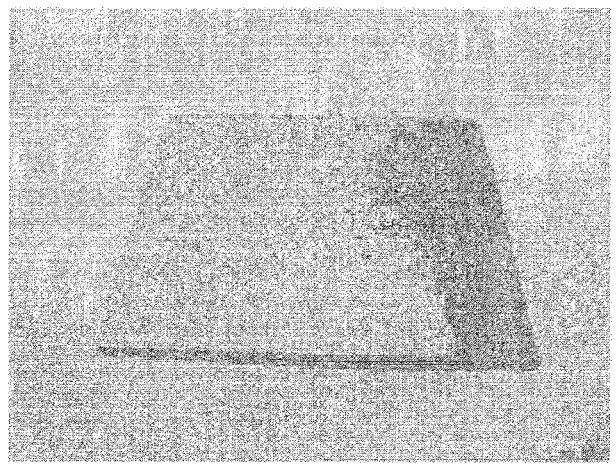
FIG. 11 is a photograph showing a condition of the surface of the sample after processing when processing has been carried out using a Cl2 gas.

Next, processing of the surface of the sample (silicon single crystal) was carried out using a Cl2 gas of a F2 gas in place of an inter-halogen compound or hydrogen halide used as the reactive gas. FIG. 11 shows a photograph showing a condition of the surface of the sample processed using the Cl2 gas, and FIG. 12 shows a photograph showing a condition of the surface of the sample processed using the F2 gas.

The processing conditions when the Cl2 gas was used were as follows: The distance between the gas jetting part and the surface of the sample was 26 mm, and a mixed gas composed of a Cl2 gas 5 vol % and an Ar gas 95 vol % as the inactive gas was used. The jetting time of the mixed gas to the sample was 15 min, the flow volume of the mixed gas was 542 sccm, the primary pressured was 0.81 MPaG, the secondary pressure was 8.3 Pa, and the temperature within the vacuum process room was 28.4° C.

The processing conditions when the F2 gas was used were as follows: The distance between the gas jetting part and the surface of the sample was 26 mm, and a mixed gas composed of an F2 gas 5 vol % and an Ar gas 95 vol % as the gas with a boiling point lower than that of the reactive gas was used. The jetting time of the mixed gas to the sample was 30 min, the flow volume of the mixed gas was 569 sccm, the primary pressure was 0.81 MPaG, the secondary pressure was 8.6 Pa, and the temperature within the vacuum process room was 27.4° C.

Figure 12:
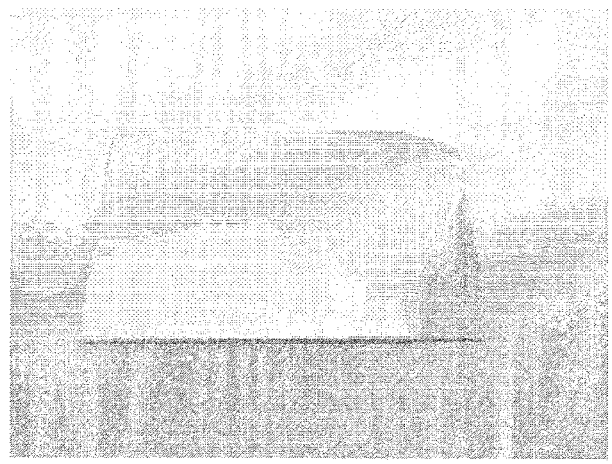
FIG. 12 is a photograph showing a condition of the surface of the sample after processing when processing has been carried out using an F2 gas.

As shown in FIG. 11 and FIG. 12, although the portion on the surface of the sample, to which the mixed gas was jetted, has changed color, the surface of the sample has been hardly etched. From this result, it is understood that when using a mixed gas of a halogen and an inactive gas, processing of the sample cannot be conducted.

From this result, it is understood that by using a mixed gas of a reactive gas, for example, an inter-halogen compound or hydrogen halide, and a gas with a boiling point lower than that of the reactive gas, processing of the surface of the sample becomes possible.

Figure 13:
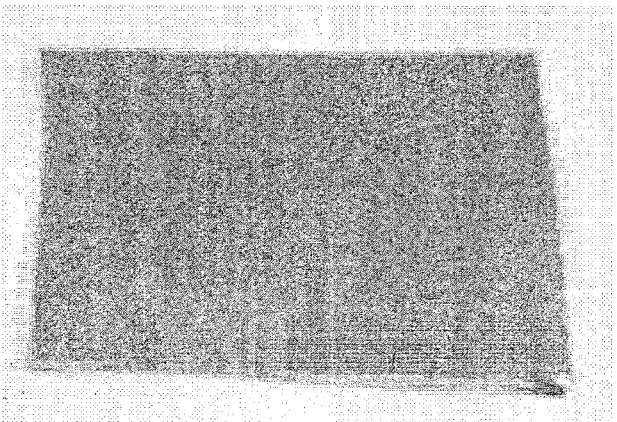
FIG. 13 is a photograph showing a condition after processing of the surface of a sample in which an oxidized silicon film has been formed, when processing of the sample has been carried out in the processing method of the present invention.

Next, using a sample in which a silicon oxide film has been formed on the surface of a silicon single crystal, processing of the surface of the sample was carried out. FIG. 13 shows a photograph showing a condition of the surface of the sample after processing.

The processing conditions were as follows: The distance between the gas jetting part and the surface of the sample was 26 mm, and a mixed gas composed of a ClF3 gas 6 vol % as the reactive gas and an Ar gas 94 vol % as the gas with a boiling point lower than that of the reactive gas was used. The jetting time of the mixed gas to the sample was 15 min, the flow volume of the mixed gas was 560 sccm, the primary pressure was 0.7 MPaG, the secondary pressure was 5 Pa, and the temperature within the vacuum process room was 28.2° C.

As shown in FIG. 13, under the above-described conditions, the silicon oxide film formed on the surface of the sample has not been processed. Accordingly, it is understood that with the above-described processing method, the etching speed of the silicon oxide film is very small compared with that of the silicon single crystal, and the etching selectivity of the silicon oxide film and the silicon material is relatively large. Therefore, in addition to formation of a pattern with a photomask, it becomes possible to form a pattern with a mask of a silicon oxide film, a silicon nitride film, a silicon oxynitride film, etc. on the surface of a silicon material and process the silicon material according to the pattern.

Thus, by forming a film that is resistant to the reactive gas on the surface of a sample as the mask of a pattern, processing of the sample according to the pattern becomes possible.

Also, as the material for a pattern mask, it is possible to use metal materials besides the above-described materials. When the reactive gas is an inter-halogen compound, it is not necessary to consider the reactivity with the metal material, so that it becomes possible to use a popular metal material that is used for the pattern mask, and processing of a sample using a mask of a metal material becomes possible.

Further, when the reactive gas is hydrogen halide, by selecting a metal material that is resistant to hydrogen halide, such as Ni, etc, processing of a sample using a mask of a metal material becomes possible.

Figure 14:
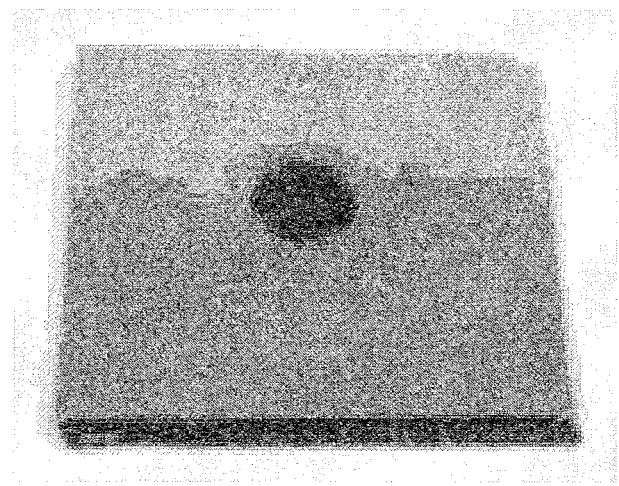
FIG. 14 is a photograph showing a condition after processing of the surface of a sample in which a natural oxidized film has been removed, when processing of the surface of the sample has been carried out in the processing method of the present invention.

Next, after removing a natural oxide film about 2 nm thick, formed on the surface of a silicon single crystal as the sample, by processing with hydrogen fluoride (HF), processing of the surface of the sample was carried out. FIG. 14 shows a photograph representing a condition of the surface of the sample after processing. Further, for comparison purpose, FIG. 15 shows a photograph representing a condition of the surface of the sample to which processing of the surface was carried out without removing the natural oxide film.

The processing conditions were as follows: The distance between the gas jetting part and the surface of the sample was 26 mm, and a mixed gas composed of a ClF3 gas 6 vol % as the reactive gas and an Ar gas 94 vol % as the gas with a boiling point lower than that of the reactive gas was used. The jetting time of the mixed gas to the sample was 5 min, the flow volume of the mixed gas was 560 sccm, the primary pressure was 0.3 MPaG, the secondary pressure was 1.5 Pa, and the temperature within the vacuum process room was 28.2° C.

The sample to which processing of the surface was carried out without removing the natural oxide film for comparison is the sample processed using a mixed gas of a ClF3 gas 6 vol % as the reactive gas and an Ar gas 94 vol % as the gas with a boiling point lower than that of the reactive gas, with the primary pressure of 0.3 MPaG and the mixed gas jetting time of 5 min. The relationship between the primary pressure, the gas jetting time, and the sample etching speed in such processing is shown in FIG. 2.

Figure 15:
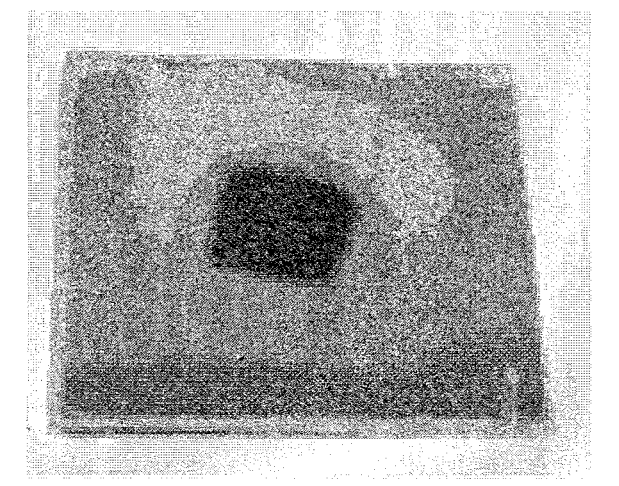
FIG. 15 is a photograph showing a condition after processing of the surface of a sample when processing of the sample has been carried out without removing an oxidized silicon film in the processing method of the present invention.
Figure 16:
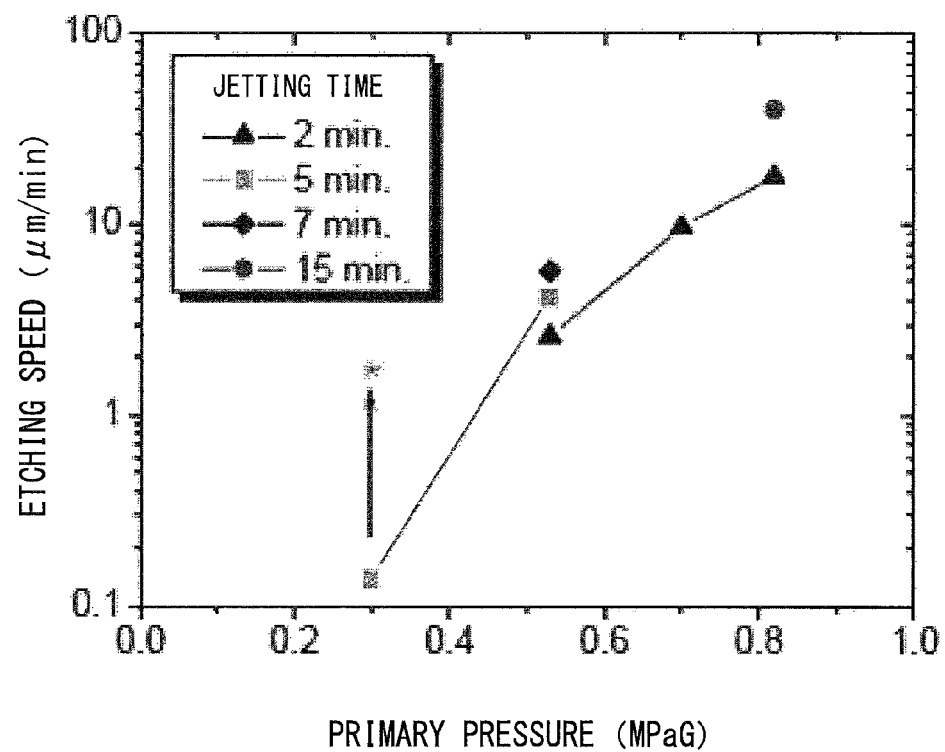
FIG. 16 is a diagram illustrating a relationship among a primary pressure, a gas jetting time to a sample, and an etching speed of the sample, in the processing method of the present invention.

If the result shown in FIG. 14 and the result shown in FIG. 16 are compared with each other, the etching depth of the sample with the natural oxide film removed, shown in FIG. 14, was 8.67 µm, whereas the etching depth of the sample shown in FIG. 15, in which the natural oxide film has not been removed, was 0.711 µm.

The etching speed of the sample in which the natural oxide film has not been removed is 0.14 µm/min, whereas the etching speed of the sample in which the natural oxide film has been removed is 1.73 µm/min. Thus, by removing the natural oxide film formed on the surface of a silicon single crystal using HF, etc., the etching speed becomes about 12 times faster.

FIG. 16 shows a relationship of the primary pressure, the gas jetting time to the sample, and the etching speed of the sample in the above-described processing. In FIG. 16, for comparison, the relation between the jetting time to the sample and the etching speed of the sample shown in FIG. 2 is shown as it is, and the result of processing the sample with the natural oxide film removed is shown by a star sign and an arrow sign.

As shown in FIG. 16, it is understood that under substantially the same conditions with respect to the primary pressure and the gas jetting time, compared with a case that the sample is processed without removing the natural oxide film, by removing the natural oxide film, the etching speed has been greatly improved.

Accordingly, by removing the natural oxide film of a silicon material serving as the sample, it is possible to improve the etching speed of the sample.

The present invention is not limited to the above-described constitution, and various other forms of constitution are possible without departing from the gist of the present invention.

EXPLANATION OF SYMBOLS

11; Gas supplying unit
12; Gas jetting part
13; Vacuum process room
14; Sample table
15; Turbo molecule pump
16; Dry pump
17; Sample
18; Molecule of mixed gas
19; Reactive cluster
20; Pressure sensor
21; Semiconductor substrate
22; MEMS sensor controller
23; Low-k wiring
24; Passivation film
25; SOG insulating layer
26; Electrode layer
27; Pressure reference vacuum
28; Cover glass
29; Capacitor and controller wiring
30; Membrane structure
31; Adhesive layer
32, 63, 74; Photoresist
40; Semiconductor element
41; Semiconductor chip
42; Semiconductor substrate
43, 52; Wiring layer
44, 53; Inter-layer insulting layer
45; Penetration hole 46; Embedded conductive layer
47; Barrier metal layer
48; Insulting layer
49, 54; Electrode pad
50, 55; Multi-layered wiring layer
51; Base
56, 72; Hole
60; Photomask
61; Quartz substrate
62; Light shielding film
64; Metal film
70; Optical slit
71; Silicon substrate
73; Slit

The invention claimed is:

1. A cluster jet processing method comprising:
   placing a sample in a vacuum process room provided with a gas jetting part for jetting out a gas into the vacuum process room; and
   processing a surface of the sample by jetting out a mixed gas composed of a reactive gas and a gas having a boiling point lower than that of the reactive gas from the gas jetting part by a pressure in a range in which liquefaction of the mixed gas is not caused, in a predetermined direction, while adiabatically-expanding the mixed gas, thereby generating a reactive cluster and jetting the reactive cluster against the sample.

2. The cluster jet processing method according to claim 1, wherein the reactive gas is an interhalogen compound gas or a hydrogen halide gas.

3. The cluster jet processing method according to claim 2, wherein the sample is made of a semiconductor material or a metal material.

4. The cluster jet processing method according to claim 1, wherein the sample is made of a semiconductor material or a metal material.

5. The cluster jet processing method according to claim 1, wherein in the processing, a pattern is formed on the surface of the sample using one or more of a photoresist, a silicon oxide film, a silicon nitride film, and a silicon oxynitride film, and the surface of the sample is processed using the pattern as a mask.

6. The cluster jet processing method according to claim 1, wherein in the processing, a pattern is formed on the surface of the sample using a metal material that is resistant to hydrogen halide, and the surface of the sample is processed using the pattern as a mask.

7. The cluster jet processing method according to claim 1, wherein in the processing, the surface of the sample is obliquely processed by jetting the reactive cluster in an oblique direction relative to the surface of the sample.

8. The cluster jet processing method according to claim 1, wherein in the processing, the surface of the sample is processed so as to be flattened by moving the gas jetting part or the sample.

9. The cluster jet processing method according to claim 1, wherein in the processing, the surface of the sample is processed such that straight line and curved line processing and/or large area processing are carried out by moving the gas jetting part or the sample.

10. The cluster jet processing method according to claim 1, wherein in the processing, the surface of the sample is processed such that a penetration hole is formed in the sample.

11. The cluster jet processing method according to claim 1, wherein in the processing, the surface of the sample is processed after removing a natural oxide film on the surface of the sample.

12. The cluster jet processing method according to claim 1,
   wherein the vacuum process room is provided with a plurality of gas jetting parts each for jetting out the mixed gas, and
   wherein in the processing, the surface of the sample is processed by carrying out one method or more methods concurrently, selected from a method of jetting out the mixed gas from each of the plurality of gas jetting parts in substantially the same direction and jetting each generated reactive cluster against the sample, a method of jetting out the mixed gas from each of the plurality of gas jetting parts in different directions from each other and jetting each generated reactive cluster against the sample, and a method of jetting out the mixed gas from each of the plurality of gas jetting parts with flow rates of the mixed gas jetted out from respective gas jetting parts and pressures by which the mixed gas is jetted out from respective gas jetting parts made substantially the same or individually controlled and jetting each generated reactive cluster against the sample.

13. A semiconductor element comprising:
   a semiconductor substrate etched by jetting out a mixed gas composed of a reactive gas and a gas having a boiling point lower than that of the reactive gas from a gas jetting part provided in a vacuum process room in which the semiconductor substrate is placed by a pressure in a range in which the mixed gas is not liquefied, in a predetermined direction, while adiabatically-expanding the mixed gas, thereby generating a reactive cluster and jetting the reactive cluster against the semiconductor substrate in the vacuum process room; and
   a base on which the semiconductor substrate is formed.

14. A micro electro mechanical system element comprising:
   a sensor; and
   a substrate on which the sensor is formed, the substrate etched by jetting out a mixed gas composed of a reactive gas and a gas having a boiling point lower than that of the reactive gas from a gas jetting part provided in a vacuum process room in which the substrate is placed by a pressure in a range in which the mixed gas is not liquefied, in a predetermined direction, while adiabatically-expanding the mixed gas, thereby generating a reactive cluster and jetting the reactive cluster against the substrate in the vacuum process room.

15. An optical component comprising:
   a substrate; and
   an optical pattern on the substrate, the optical pattern formed by jetting out a mixed gas composed of a reactive gas and a gas having a boiling point lower than that of the reactive gas from a gas jetting part provided in a vacuum process room in which the substrate is placed by a pressure in a range in which the mixed gas is not liquefied, in a predetermined direction, while adiabatically-expanding the mixed gas, thereby generating a reactive cluster and jetting the reactive cluster against the substrate in the vacuum process room.

* * * * *